United States Patent
Yoshii et al.

(10) Patent No.: US 7,060,174 B2
(45) Date of Patent: Jun. 13, 2006

(54) METHOD FOR ELECTROCHEMICAL SYNTHESIS OF SUPERCONDUCTING BORON COMPOUND $MGB_2$

(75) Inventors: Kenji Yoshii, Hyogo (JP); Junichiro Mizuki, Hyogo (JP); Hideki Abe, Ibaraki (JP); Hideaki Kitazawa, Ibaraki (JP); Akiyuki Matsushita, Ibaraki (JP)

(73) Assignees: Japan Atomic Energy Research Institute, Chiba-ken (JP); National Institute for Materials Science, Ibaraki-Ken (JP)

( * ) Notice: Subject to any disclaimer, the term of this patent is extended or adjusted under 35 U.S.C. 154(b) by 316 days.

(21) Appl. No.: 10/364,422

(22) Filed: Feb. 12, 2003

(65) Prior Publication Data

US 2003/0150744 A1  Aug. 14, 2003

(30) Foreign Application Priority Data

Feb. 21, 2002  (JP)  .............................. 2002-045018

(51) Int. Cl.
*B41M 5/20* (2006.01)
*C04B 39/24* (2006.01)
*H01L 39/00* (2006.01)

(52) U.S. Cl. ......................... 205/51; 505/100; 505/150

(58) Field of Classification Search .................. 205/51, 205/358, 334, 354; 505/100, 150, 300, 450, 505/510, 700, 704
See application file for complete search history.

(56) References Cited

U.S. PATENT DOCUMENTS

| | | | | |
|---|---|---|---|---|
| 2,384,835 A | * | 9/1945 | Hanawalt et al. | ........... 205/404 |
| 3,396,094 A | * | 8/1968 | Sivilotti et al. | ............. 205/405 |
| 2002/0173428 A1 | * | 11/2002 | Thieme et al. | .............. 505/100 |

OTHER PUBLICATIONS

Superconductivity at 39 K in magnesium diboride. By: Nagamatsu, Jun; Nakagawa, Norimasa; Muranaka, Takahiro; Zenitani, Yuji; Akimitsu, Jun. Nature, Mar. 1, 2001, vol. 410 Issue 6824, p. 63, 2p, 1 diagram, 3 graphs; (AN 4181112).*

* cited by examiner

*Primary Examiner*—Nam Nguyen
*Assistant Examiner*—Luan V. Van
(74) *Attorney, Agent, or Firm*—Banner & Witcoff, Ltd.

(57) ABSTRACT

A method for electrochemical synthesis of a superconducting boron compound $MgB_2$ which comprises the steps of preparing a powder mixture of magnesium chloride, sodium chloride, potassium chloride and magnesium borate, drying the mixture by electrical heating at a temperature of 400° C. or below under an inert gas atmosphere, and further heating the mixture electrically at a temperature of 400° C. or above so that it is melted and undergoes chemical reaction.

8 Claims, 2 Drawing Sheets

METHOD FOR ELECTROCHEMICAL SYNTHESIS OF SUPERCONDUCTING BORON COMPOUND MGB$_2$

This application is based upon and claims the benefit of priority from Japanese Patent Application No. 2002-045018, filed Feb. 21, 2002, the entire contents of this application are incorporated herein by reference.

BACKGROUND OF THE INVENTION

Early in 2001, MgB$_2$ was discovered as a boron compound having a superconductivity transition temperature of 39 K and it is expected to find applications in the manufacture of superconducting wires and thin films. Synthesis of MgB$_2$ involves difficulty due to the high vapor pressure of Mg.

The present invention relates to a wire preparing technique that is essential to commercial application of MgB$_2$ and it also relates to a technique for preparing thin films of MgB$_2$ that are required to put this compound into device form. According to the invention, a molten mixture of magnesium chloride, sodium chloride, potassium chloride and magnesium borate is treated by an electrochemical technique at 400° C. or above to prepare a superconducting wire or thin film of a boron compound MgB$_2$ that shows zero resistance at a superconductivity transition temperature of about 39 K or below.

The following three techniques are known to be capable of preparing superconducting wires of MgB$_2$ and the thin films that are required to put MgB$_2$ into device form: 1) subjecting solid Mg and B samples to high-temperature reaction in vacuum; 2) performing a similar reaction in a closed system as in a quartz or stainless steel tube either evacuated or filled with an inert gas such as argon; 3) evaporating Mg at high temperature in vacuum so that its vapor is deposited on a B target for reaction.

In order to perform heating in vacuum or in an evacuated closed system, not only a vacuum pump that usually costs at about 200,000 yen but also an apparatus capable of heating up to about 900–1000° C. which are high enough to carry out the reaction of a mixed solid sample must be used. There is no need to use a vacuum pump if the reaction is performed under an inert gas but even in this case a heating apparatus of the type described above is necessary.

SUMMARY OF THE INVENTION

The present invention provides a method of synthesizing MgB$_2$ at low cost by an electrochemical reaction at 400° C. and above without using a vacuum pump but relying upon efficient utilization of a power supply. In the method, a melt of a mixture of magnesium chloride, sodium chloride, potassium chloride and magnesium borate is treated by an electrochemical technique at 400° C. or above under an inert atmosphere created by argon gas so as to prepare a superconducting wire or thin film of a superconducting boron compound MgB$_2$. Stated specifically, the invention provides a method for electrochemical synthesis of a superconducting boron compound MgB$_2$ which comprises the steps of preparing a powder mixture of magnesium chloride, sodium chloride, potassium chloride and magnesium borate, drying the mixture by electrical heating at a temperature of 400° C. or below under an inert gas atmosphere, and further heating the mixture electrically at a temperature of 400° C. or above so that it is melted and undergoes chemical reaction.

DETAILED DESCRIPTION OF THE INVENTION

The reaction temperature for obtaining MgB$_2$ in the method of the invention is at least 400° C., preferably between 400 and 800° C., more preferably between 400 and 700° C., and most preferably between 400 and 600° C.

Commercial grades of magnesium chloride (MgCl$_2$), sodium chloride (NaCl), potassium chloride (KCl) and magnesium borate (MgB$_2$O$_4$) in powder form are weighed at a molar ratio of 10:(10−x):x:2 in a total quantity of two grams and mixed uniformly. The value or x, or the quantity of potassium chloride is adjusted to lie between 3 and 7. The thus prepared mixture is hereunder referred to as a powder sample.

Figure 1:
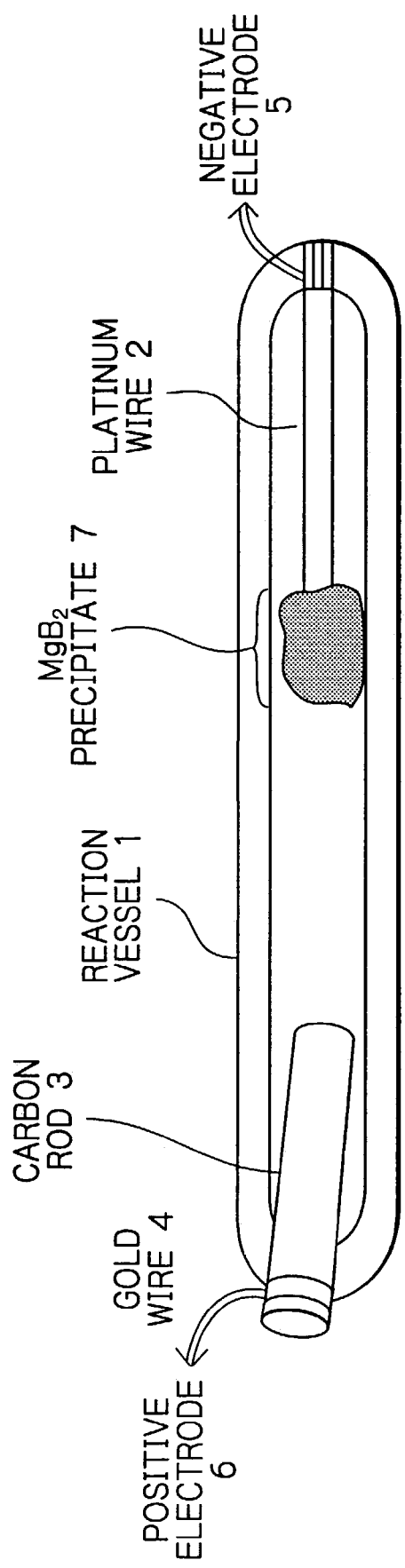
FIG. 1 shows the structure of a reaction vessel used to precipitate MgB$_2$ in the invention.

As FIG. 1 shows, the powder sample is put into a box-type reaction vessel 1 that is made of aluminum oxide and which measures 100 mm by 10 mm by 10 mm, with a wall thickness of about 1 mm. A platinum wire 2 having a diameter of 1 mm is guided on the inner surface of the bottom of the reaction vessel and fixed to an end of it in the longitudinal direction. Similarly, a carbon rod 3 having a diameter of 5 mm is fixed to the other of the reaction vessel. A gold wire 4 having a diameter of 0.3 mm is thermocompressed to each of the platinum wire and the carbon rod.

The reaction vessel containing the powder sample is put into a quartz tube (not shown) having a diameter of about 40 mm, which is filled with argon gas. The quartz tube is then inserted into an electric furnace. A dc power supply is provided and the gold wire on the platinum wire 2 is connected to the negative electrode 5 and the gold wire on the carbon rod 3 is connected to the positive electrode 6. As argon gas is flowed at a rate of about 1 L/min, the powder sample is heated to 400° C. or below and left to stand for 1 hour until it dries.

Subsequently, the powder sample is heated up to 400° C. or above until it melts. A voltage of 5 V dc is applied to the two gold wires and when a current is found to be flowing in an amount of several tens of milliamperes, the powder sample is left to stand for an additional one hour. Thereafter, the powder sample is reverted to room temperature and recovered into the atmosphere, giving a black precipitate of MgB$_2$ as it is deposited on the platinum wire 2.

The reaction mechanism behind the precipitation of MgB$_2$ is as follows:

Pt electrode (−): $Mg^{2+} + 2B^{3+} + 8e \rightarrow MgB_2$ (e is an electron)

C electrode (+): $4O^{2-} \rightarrow 2O_2 + 8e$

Adding together: $MgB_2O_4 \rightarrow MgB_2 + 2O_2$

Note that magnesium chloride, potassium chloride and sodium chloride have a catalytic effect for lowering the melting point.

EXAMPLE

Magnesium chloride (MgCl$_2$), sodium chloride (NaCl), potassium chloride (KCl) and magnesium borate (MgB$_2$O$_4$)

were weighed at a molar ratio of 10:7:3:2 in a total quantity of two grams and mixed uniformly. The mixture was put into a reaction vessel of the design shown in FIG. 1 and then dried at about 400° C. for 1 hour under an argon atmosphere, followed by heating at 600° C. for an additional one hour to yield a black precipitate.

Figure 2:
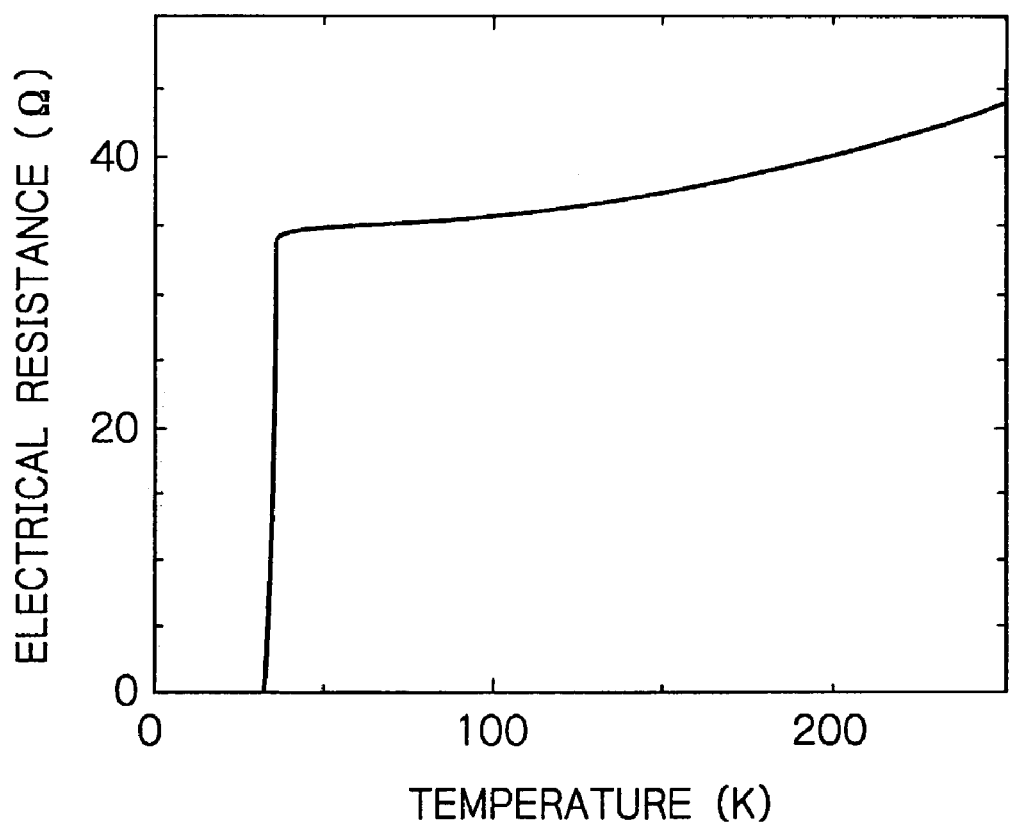
FIG. 2 is a graph showing the temperature dependency of the electrical resistance of a sample that was prepared by the invention from magnesium chloride (MgCl$_2$), sodium chloride (NaCl), potassium chloride (KCl) and magnesium borate (MgB$_2$O$_4$) as they were weighed at a molar ratio of 10:7:3:2 in a total quantity of two grams.

The electrical resistance of the obtained sample changed with temperature as shown in FIG. 2. A current of 0.01 milliampere was initially applied for measurement. As the temperature was lowered, the resistance of the sample decreased, thus presenting a property similar to that of metallic $MgB_2$. As the temperature further dropped to about 39 K and below, the sample became resistanceless, indicating a transition to the superconductive state.

Superconducting wires and thin films of metallic $MgB_2$ which shows superconductivity can be prepared by applying an electrochemical technique to a mixture of magnesium chloride, sodium chloride, potassium chloride and magnesium borate. Reaction in an argon atmosphere eliminates the need of using a vacuum pump and thus reduces the cost of synthesis. In addition, the reaction temperature is made lower than in the prior art and, hence, the cost of supplying power is also reduced.

What is claimed is:

1. A method for electrochemical synthesis of a superconducting boron compound $MgB_2$, which comprises the steps of:
   preparing a powder mixture of magnesium chloride, sodium chloride, potassium chloride and magnesium borate at a molar ratio of 10:(10−x):x:2, wherein x is between 3 and 7;
   putting the powder mixture into a reaction vessel having a platinum wire at one end and a carbon rod at an opposite end, said platinum wire being connected to the negative electrode of a direct current via a gold wire fixed to the platinum wire and said carbon rod being connected to the positive electrode of the power supply via a gold wire fixed to the carbon rod;
   heating the reaction vessel at a temperature of 400° C. or below under an inert gas atmosphere to dry the powder mixture;
   heating the reaction vessel at a temperature of 400° C. or above under an inert gas atmosphere to melt the powder mixture and;
   applying a direct current voltage through the power supply to the two gold wires to establish current in the powder and precipitate superconducting boron compound $MgB_2$ onto the platinum wire.

2. The method of claim 1 wherein the reaction vessel is heated to a temperature between 400 and 800° C. to melt the powder mixture.

3. The method of claim 2 wherein the reaction vessel is heated to a temperature between 400 and 700° C. to melt the powder mixture.

4. The method of claim 3 wherein the reaction vessel is heated to a temperature between 400 and 600° C. to melt the powder mixture.

5. The method of claim 1 wherein the inert atmosphere comprises argon.

6. The method of claim 2 wherein the inert atmosphere comprises argon.

7. The method of claim 3 wherein the inert atmosphere comprises argon.

8. The method of claim 4 wherein the inert atmosphere comprises argon.

* * * * *